(12) United States Patent
Tsuchiya

(10) Patent No.: US 6,392,161 B1
(45) Date of Patent: May 21, 2002

(54) MOUNTING SUBSTRATE

(75) Inventor: Michitoshi Tsuchiya, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/500,048

(22) Filed: Feb. 8, 2000

(30) Foreign Application Priority Data

Feb. 10, 1999 (JP) ............................................. 11-032254

(51) Int. Cl.⁷ ............................ H01R 12/04; H05K 1/11
(52) U.S. Cl. ....................................... 174/261; 324/754
(58) Field of Search ................................ 174/261, 262; 324/754–762; 228/180.1–180.22; 257/797

(56) References Cited

U.S. PATENT DOCUMENTS

| | | | | |
|---|---|---|---|---|
| 6,064,217 A | * | 5/2000 | Smith | 324/760 |
| 6,094,059 A | * | 7/2000 | Frankeny et al. | 324/757 |
| 6,094,060 A | * | 7/2000 | Frankeny et al. | 324/760 |
| 6,201,193 B1 | * | 3/2001 | Hashimoto | 174/260 |

* cited by examiner

Primary Examiner—Jeffrey Gaffin
Assistant Examiner—Jeremy Norris
(74) Attorney, Agent, or Firm—Rader, Fishman & Grauer PLLC; Ronald P. Kananen

(57) ABSTRACT

A mounting substrate includes: a base substrate having a usable substrate region used as part of a product and an unusable substrate region to be discarded, the base substrate being subjected to soldering treatment in which the surface thereof is brought into contact with solder; and on-substrate members arranged on a soldering surface side, to be subjected to the soldering treatment, of the base substrate, the on-substrate members being in a state in which the surfaces have a wettability against solder upon soldering treatment. The on-substrate members are arranged in a non-contact portion with solder upon solder treatment in the unusable substrate region, in the usable substrate region, or in the non-contact portion and the usable substrate region. With this configuration, even if solder is stuck on the on-substrate members, any noxious material containing waste does not occur when the unusable substrate region is separated from the usable substrate region and is discarded.

11 Claims, 2 Drawing Sheets

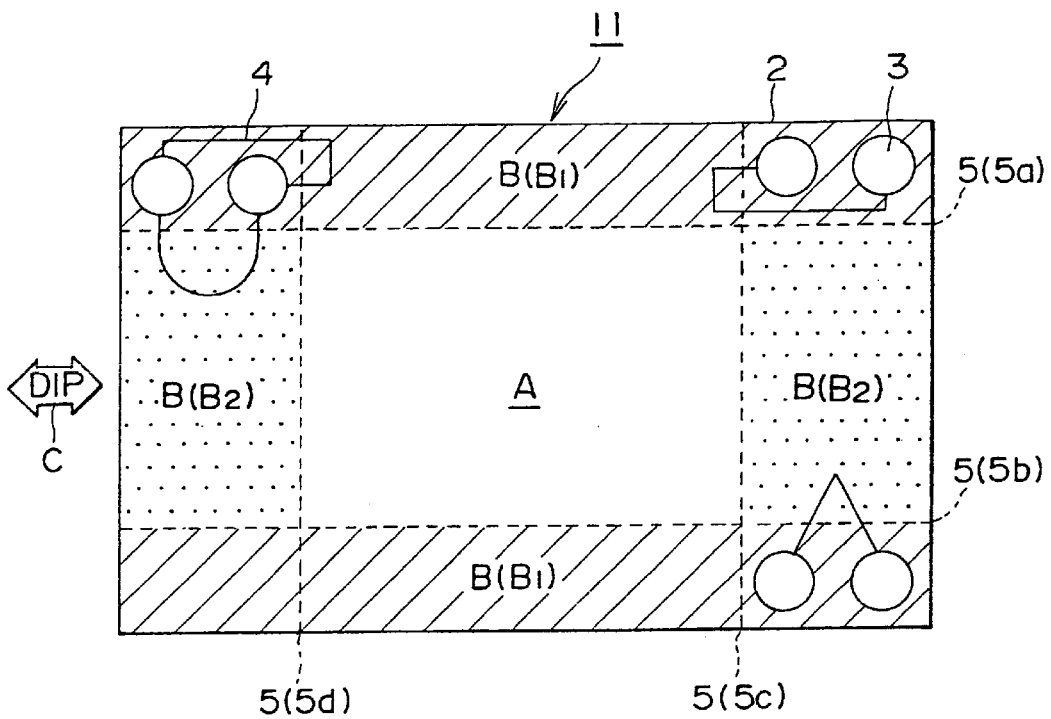
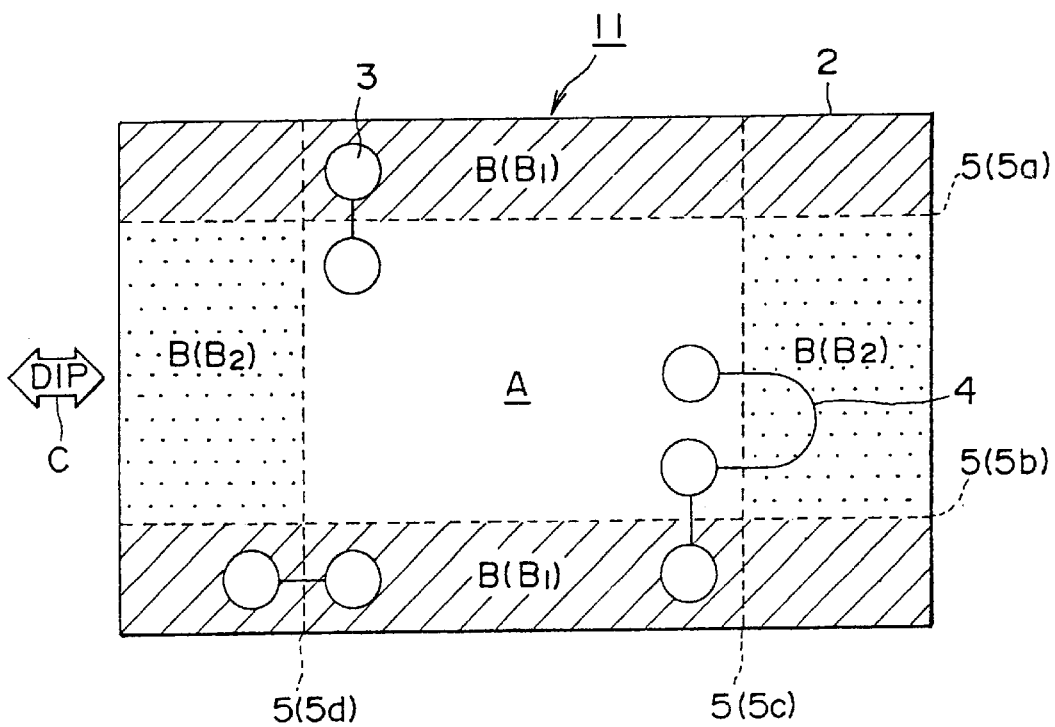

MOUNTING SUBSTRATE

BACKGROUND OF THE INVENTION

The present invention relates to a mounting substrate on which electronic parts are to be mounted, and which includes a base substrate having a usable substrate region used as part of electronic equipment to be manufactured and an unusable mounting region to be discarded.

A known mounting substrate on which electronic parts are to be mounted includes, as shown in FIG. 1, a base substrate 22 having a usable substrate region A used as part of electronic equipment to be manufactured and an unusable substrate region B to be discarded at the subsequent step.

The process of mounting electronic parts on such a mounting substrate 21 includes a dipping step for soldering the electronic parts on the base substrate 22 by a dip soldering method. Prior to this step, V-shaped grooves 23 are formed on a soldering surface side, on which solder is stuck at the dipping step, of the base substrate 22 by sawing. The grooves 23 are used for easily separating the base substrate 22 into the usable substrate region A and the unusable substrate region B by cleaving the base substrate 22 along the grooves 23.

For example, as shown in FIG. 1, in the case where the usable substrate region A having an approximately rectangular shape is formed at an approximately central portion of the base substrate 22 having an approximately rectangular shape, and the remaining peripheral portion is taken as the unusable substrate region B, two grooves 23a and 23b extending along a pair of the transverse sides of the base substrate 22 and two grooves 23c and 23d extending along a pair of longitudinal sides of the base substrate 22 are formed as the grooves 23. In this case, areas surrounded by the transverse sides of the base substrate 22 and the grooves 23a and 23b extending in parallel to the transverse sides are taken as a first unusable substrate region $B_1$, and areas surrounded by the longitudinal sides of the base substrate 22 and the grooves 23c and 23d extending in parallel to the longitudinal sides and not crossing the first unusable substrate region $B_1$ are taken as a second unusable substrate region $B_2$.

Conduction state checking lands (hereinafter, referred to as simply as "lands") 24 for checking, on the basis of the conducting state, whether or not the grooves 23 are certainly formed, are formed in the first unusable substrate region $B_1$ and the unusable substrate region $B_2$ on the soldering surface side of the base substrate 22 in which the grooves 23 are formed.

To be more specific, pairs of the lands 24 are formed such that each pair of the lands 24 are arranged on both sides of each groove 23 and are electrically connected to each other by means of a straight wiring pattern crossing the groove 23. Accordingly, in the example shown in FIG. 1, four pairs of the lands 24 corresponding to the four grooves 23a to 23d are provided.

The above-described mounting substrate 21, in which the lands 24 and the wiring patterns 25 are provided on the soldering surface side of the base substrate 22 and the grooves 23 are formed in the base substrate 22, is gradually moved, for example, in the direction shown by a hollow arrow C in FIG. 1, that is, from one end side to the other end side of the base substrate 22 in the transverse direction or from the other end side to the one end side of the base substrate 22 in the transverse direction, to be floated in a solder bath, whereby the soldering surface is brought in contact with solder and the solder is stuck on a specific soldering portion At this soldering step, for example, the entire first unusable substrate region $B_1$ is supported by rail-like supporting claws provided in parallel to the soldering direction (shown by the arrow C), with a result that the entire first unusable substrate region $B_1$ is taken as a non-contact portion, which is not brought into contact with solder.

As described above, for the related art mounting substrate 21 shown in FIG. 1, in the case of sticking solder on the soldering surface side, the entire first unusable substrate region $B_1$ is taken as the non-contact portion against solder because it is supported by the supporting claws. In other words, the second unusable substrate region $B_2$ and the usable substrate region A of the base substrate 22 are brought into contact with solder.

On the other hand, the conduction state checking lands 24 are member necessary for manufacture, which are useful only for checking the conduction state in the manufacturing process, and in order to ensure the conduction of the lands 24 prior to formation of the grooves 23 performed before soldering treatment, an insulating film, typically a resist film, is removed from the surface of each of the lands 24. As a result, upon soldering treatment, the lands 24 are in a state having a wettability against solder.

Such lands 24 are arranged on both the sides of each groove 23, and accordingly, for example, in the case of a pair of the lands 24 corresponding to one groove 23 extending in parallel to the transverse side, one of the lands 24 is arranged in the second unusable substrate region $B_2$, which is brought into contact with solder. As a result, solder is stuck on the lands 24 in the second unusable substrate region $B_2$ upon soldering treatment.

Most of solder materials are composed of noxious tin-lead based metals. Accordingly, if it is intended to separate the first and second unusable substrate regions $B_1$ and $B_2$ from the base substrate 22 at the subsequent step and to discard them, they become wastes containing noxious materials which exert adverse effect on global environments. Also since solder is stuck even on portions not required to be soldered, such as the conduction state checking lands 24, the usage of solder becomes large, thereby causing an inconvenience in raising the manufacturing cost of electric equipment manufactured by using the mounting substrate 21.

For the related art mounting substrate 21, in addition to the conduction state checking lands 24, necessary members for manufacture, such as other lands necessary only for manufacture and alignment marks are provided generally in the unusable substrate region B on the soldering surface side of the base substrate 22. If these members are arranged in the second unusable substrate region $B_2$ and are in a state having a wettability against solder upon solder treatment because of removal of the resist films from the surfaces of the members, solder is stuck on the members like the conduction state checking lands 24. As a result, problems occur upon discarding the unusable substrate $B_1$, as it becomes a noxious containing waste, and the usage of solder becomes large.

SUMMARY OF THE INVENTION

To provide a mounting substrate including a base substrate having a usable substrate region and an unusable substrate region, and also including on-substrate members, characterized in that even if solder is stuck on the on-substrate members, any noxious material containing waste does not occur when the unusable substrate region is separated from the usable substrate region and is discarded.

To achieve the above object, according to the present invention, there is provided a mounting substrate including:

a base substrate having a usable substrate region used as part of a product and an unusable substrate region to be discarded, the base substrate being subjected to soldering treatment in which the surface thereof is brought into contact with solder; and on-substrate members arranged on a soldering surface side, to be subjected to the soldering treatment, of the base substrate, the on-substrate members being in a state in which the surfaces have a wettability against solder upon soldering treatment, wherein the on-substrate members are arranged in a non-contact portion with solder upon solder treatment in the unusable substrate region, in the usable substrate region, or in the non-contact portion and the usable substrate region.

In the case where the on-substrate members are arranged in the non-contact portion with solder upon soldering treatment in the unusable substrate region, even if the surfaces of the on-substrate members are in a state having a wettability against solder upon soldering treatment, solder is not stuck on the on-substrate members. In the case where the on-substrate members are arranged in the usable substrate region, even if solder is stuck on the on-substrate members, since the usable substrate region is not discarded, any noxious material containing material does not occur when the unusable substrate region is discarded. As a result, according to the mounting substrate of the present invention in which the on-substrate members are arranged in the non-contact portion with solder in the unusable substrate region, in the usable substrate region, or in the non-contact portion or the usable substrate region, it is possible to prevent occurrence of a noxious material containing waste when the unusable substrate region is discarded. Further, solder is not stuck on the on-substrate members arranged in the non-contact portion, the usage of solder upon soldering treatment can be reduced. Accordingly, it is possible to reduce the material cost, and hence to reduce the manufacturing cost of electronic equipment using the mounting substrate.

BRIEF DESCRIPTION OF THE DRAWINGS

FIG. 2 is a schematic plan view showing a first embodiment of a mounting substrate of the present invention; and FIG. 3 is a schematic plan view showing a second embodiment of the mounting substrate of the present invention.

DETAILED DESCRIPTION OF THE PREFERRED EMBODIMENTS

Figure 1:
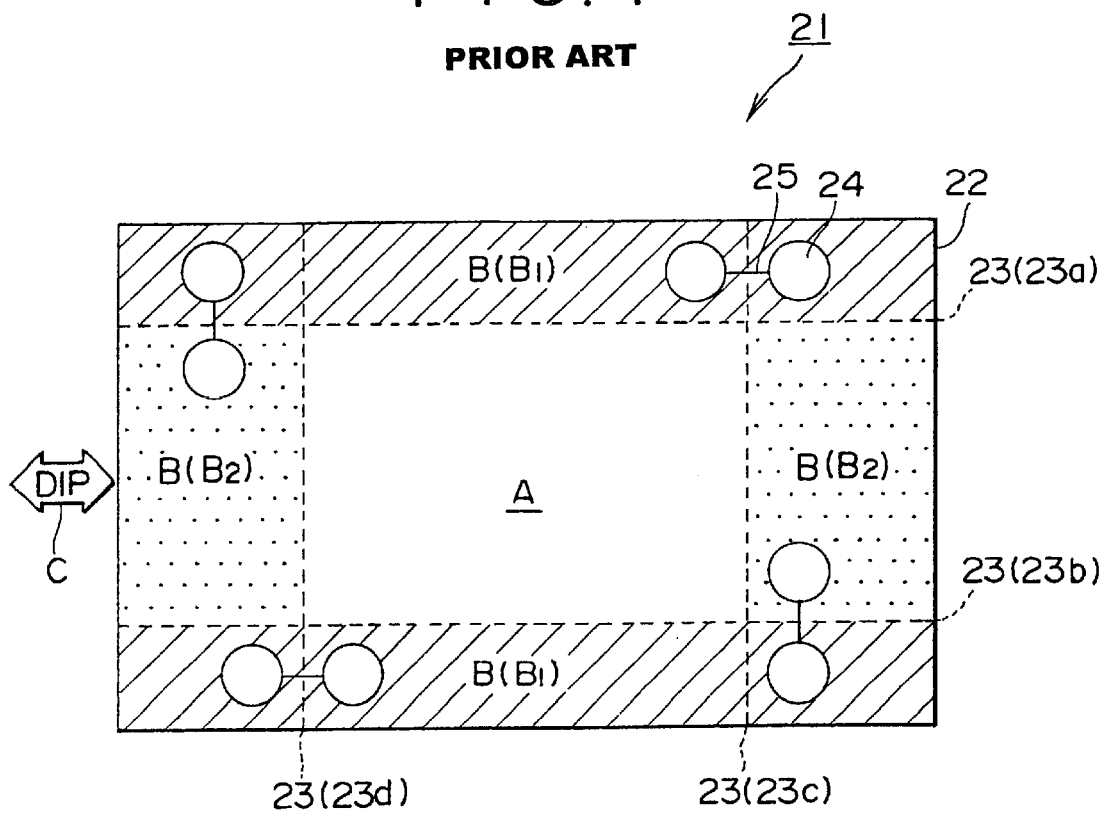
FIG. 1 is a schematic plan view showing one example of a related art mounting substrate.

Hereinafter, embodiments of the present invention will be described with reference to the drawings.

FIG. 2 is a schematic plan view showing a first embodiment of a mounting substrate of the present invention. In this figure, a soldering surface side, on which solder is to be stuck upon soldering treatment, of the mounting substrate is shown.

Referring to FIG. 2, the mounting substrate 1 includes a base substrate 2, lands 3 as on-substrate members of the present invention, which are arranged on the soldering surface side of the base substrate 2, and wiring patterns 4 formed on the soldering surface side of the base substrate 2 for connecting the lands 3 to each other. The base substrate 2 is composed of a usable substrate region A used as part of electronic equipment to be manufactured, and an unusable substrate region B to be discarded at the subsequent step.

V-shaped grooves 5 for facilitating separation of the usable substrate region A from the unusable substrate region B, are formed on the soldering surface side of the base substrate 2 by sawing.

According to the first embodiment, the usable substrate region A having an approximately rectangular shape is formed at an approximately central portion of the base substrate 2 having an approximately rectangular shape, and the remaining peripheral portion is taken as the unusable substrate region B. Two transverse grooves 5a and 5b, extending along a pair of transverse sides of the base substrate 2, and two longitudinal grooves 5c and 5d, extending along a pair of longitudinal sides of the base substrate 2, are formed as the grooves 5. In this case, areas surrounded by the transverse sides of the base substrate 2 and the transverse grooves 5a and 5b, extending in parallel to the transverse sides, are taken as a first unusable substrate region $B_1$, and areas surrounded by the longitudinal sides of the base substrate 2 and the longitudinal grooves 5c and 5d, extending in parallel to the longitudinal sides and not crossing the first unusable substrate region $B_1$, are taken as a second unusable substrate region $B_2$.

At the soldering step performed after the transverse grooves 5a and 5b and the longitudinal grooves 5c and 5d are formed, the base substrate 2 is subjected to soldering treatment by bringing the surface thereof into contact with solder, for example, by a dip soldering method. In this embodiment, the mounting substrate 1 is gradually moved, for example, in the direction shown by a hollow arrow C in FIG. 2, that is, from one side end to the other end side of the base mounting 2 in the transverse direction or from the other end side to the one side end of the base substrate 2 in the transverse direction, to be floated in a solder bath, whereby the soldering surface of the base substrate 2 is brought into contact with solder, and solder is stuck on a specific soldering portion.

At this soldering step, for example, the entire first unusable substrate region $B_1$ is supported by rail-like supporting claws provided in parallel to the soldering direction (shown by the arrow C), with the result that the entire first unusable substrate region $B_1$ is taken as a non-contact portion, which is not brought into contact with solder.

The lands 3 arranged on the soldering surface side of the base substrate 2 are used for checking, on the basis of the conduction state, whether or not the transverse grooves 5a and 5b and the longitudinal grooves 5c and 5d are certainly formed, and therefore, they are necessary for manufacture and are useful only for checking the conduction state in the manufacturing process. In order to ensure the conduction of the lands 24 prior to formation of the transverse grooves 5a and 5b and longitudinal grooves 5c and 5d performed before soldering treatment, an insulating film, typically a resist film, is removed from the surface of each of the lands 3. As a result, upon soldering treatment, the lands 3 are in a state having a wettability against solder.

According to the first embodiment, three pairs of the lands 3 are arranged in the first unusable substrate region $B_1$ in such a manner that each pair of the lands 3 are connected to each other by means of one or more wiring patterns 4. To be more specific, one pair of the lands 3 are arranged on one side of the transverse groove 5a and one side of the longitudinal groove 5c; another pair of the lands 3 are arranged on one side of the transverse groove 5b and on one side of the longitudinal groove 5c; and a further pair of the lands 3 are arranged on one side of the transverse groove 5a and on one side of the longitudinal groove 5d.

A plurality of wiring patterns 4, each of which connects one pair of the lands 3 to each other, are each provided for one groove 5. Each wiring pattern 4 is formed in such a manner as to connect one pair of the lands 3 to the other pair of the lands 3 while crossing one groove 5 twice or more but not crossing another groove 5. Each pair of the lands 3 are connected to each other by means of at least one of the wiring patterns 4.

Accordingly, in the first embodiment, since the two transverse grooves 5a and 5b and the two longitudinal grooves 5c and 5d are formed, four pieces of the wiring patterns 4 corresponding to the four grooves 5a, 5b, 5c, and 5d are formed. The four wiring patterns 4 are composed of the pattern crossing only the transverse groove 5a, the pattern crossing only the transverse groove 5b, the patter n crossing only the longitudinal groove 5c, and the pattern crossing only the longitudinal groove 5d. With respect to the three pairs of the lands 3 provided on the base substrate 2, each pair of the lands 3 are connected to each other by means of at least one of the four wiring patterns 4.

To be more specific, of the three pairs of the lands 3, one pair of the lands 3 are connected to each other by means of the wiring pattern 4 crossing the longitudinal groove 5c; another pair of the lands 3 are connected to each other by means of the wiring pattern 4 crossing the transverse groove 5b; and the remaining pair of the lands 3 are connected to each other by the wiring pattern 4 crossing the transverse groove 5a and the wiring pattern 4 crossing the longitudinal groove 5d.

For the mounting substrate 1 having the above configuration, since the conduction state checking lands 3 are all formed in the first unusable substrate region $B_1$, which is entirely taken as a non-contact portion with solder because it is supported by the supporting pieces upon soldering treatment by the dip soldering method, it is possible to prevent the sticking of solder on the lands 3 upon soldering treatment. As a result, the first unusable substrate region $B_1$ and the second unusable substrate region $B_2$ are not stuck with a material being noxious to global environments, such as lead contained in solder, it is possible to prevent occurrence of noxious material containing wastes when the first unusable substrate region $B_1$ and the second unusable substrate region $B_2$ are separated from the usable substrate region A of the base substrate 2 and are discarded.

Since the sticking of solder on the lands 3 not required to be stuck with solder can be prevented, it is possible to reduce the usage of solder upon soldering treatment and hence to reduce the material cost.

Further, according to the first embodiment, of the three pairs of the lands 3 formed on the base substrate 2, one pair of the lands 3 are formed by means of, for example, the two wiring patterns 4, the formation of the transverse groove 5a and the longitudinal groove 5d can be confirmed only by means of one pair of the lands 3. In other words, the formation of the grooves 5 having the same number as that of the grooves formed in the related art mounting substrate can be confirmed by means of the lands 3 of the number smaller than that of the lands formed on the related art mounting substrate. Accordingly, the number of the lands 3 provided on the base substrate 2 can be reduced, so that it is possible to increase the degree of freedom in the layout, for example, form other patterns on the base substrate 2, and to reduce the material cost required for forming the lands 3. As a result, it is possible to reduce the manufacturing cost of electronic equipment using the mounting substrate 1.

In the example shown in FIG. 2, the paired lands 3 are arranged only on one side of each groove 5, and the wiring pattern 4 for connecting these lands 3 to each other is formed not only into a straight-line shape but formed into a straight-line shape having a curved portion or a bent portion, more concretely, into a rectangular shape, V-shape or U-shape. The wiring pattern, however, may be formed into any shape insofar as it crosses one groove twice or more. Further, the size and shape of the lands 3 are not limited to those shown in FIG. 2.

Next, a second embodiment of the mounting substrate of the present invention will be described with reference to FIG. 3. FIG. 3 is a schematic plan view of the mounting substrate according to the second embodiment, showing the soldering surface side on which solder is to be stuck upon soldering treatment. In FIG. 3, parts corresponding to those in FIG. 2 showing the first embodiment are designated by the same characters.

A mounting substrate 11 in the second embodiment is different from the mounting substrate 1 in the first embodiment in that conduction state checking lands 3 are arranged not only in a first unusable substrate region $B_1$ taken as a non-contact portion with solder but also in a usable substrate region A.

In the mounting substrate 11, according to the second embodiment, three sets of the lands 3 are arranged on the soldering surface side of the base substrate 2. Of the three sets of the lands 3, two sets are each composed of the two lands 3 connected to each other by means of one wiring pattern 4, and the remaining set is composed of the three lands 3 connected to each other by means of the two wiring patterns 4. Of the two sets each composed of the two lands 3, one set is configured such that the two lands 3 are both arranged in the first unusable substrate region $B_1$, and the remaining set is configured such that the two lands 3 are arranged in the first unusable substrate region $B_1$ and the usable substrate region A, respectively.

To be more specific, in the former set in which the two lands are both arranged in the first unusable substrate region $B_1$, the two lands 3 are arranged on both side of the longitudinal grooves 5d, and therefore, they are connected to each other by means of the wiring pattern 4 crossing the longitudinal groove 5d. In the latter set in which the two lands 3 are arranged in the first unusable substrate region $B_1$ and the usable substrate region A respectively, the two lands 3 are arranged on both sides of the transverse groove 5a, and therefore, they are connected to each other by means of the wiring pattern 4 crossing the transverse groove 5a.

In the set composed of the three lands, one land 3 is arranged in the first unusable substrate region $B_1$, and the two lands 3 are arranged in the usable substrate region A. In such a set, the land 3 formed in the first unusable substrate region $B_1$ and one of the two lands 3 formed in the usable substrate region A are arranged on both sides of the transverse groove 5b, and thereby, they are connected to each other by means of the wiring pattern 4 crossing the transverse groove 5b.

Further, in the set composed of the three lands 3, the two lands 3 formed in the usable substrate region A are used for confirming the formation of the longitudinal groove 5c and are arranged on one side of the longitudinal groove 5c. Accordingly, the two lands 3 in the usable substrate region A are connected to each other by means of the wiring pattern 4 which extends from one of the two lands 3, crossing the same longitudinal groove 5c twice or more but not crossing the other grooves 5a, 5b and 5d, and is connected to the other of the two lands 3. Such a wiring pattern 4 is formed into, for example, a U-shape.

In the mounting substrate 11 having the above configuration, the conduction state checking lands 3 are formed not only in the first unusable substrate region $B_1$, entirely taken as the non-contact portion with solder, but also in the usable substrate region A, and the surfaces of all of the lands 3, from which resist films are removed, are in a state having a wettability against solder. As a result, even the lands 3 arranged in the usable substrate region A are stuck with solder upon soldering treatment; however, since the usable substrate region A is not discarded, any noxious material containing waste does not occur when the first unusable substrate region $B_1$ and the second unusable substrate region $B_2$ are separated from the usable substrate region A of the base substrate 2 and are discarded. The sticking of solder on the lands 3 in the usable substrate region A does not cause any problem.

In the second embodiment, of the three sets of the lands 3 formed on the base substrate 2, the lands 3 in one set are connected to each other by means of, for example, the two wiring patterns 4, and accordingly, the formation of the transverse groove 5b and the longitudinal groove 5c can be confirmed only by the lands 3 in such a set. Accordingly, like the first embodiment, the number of the lands 3 provided on the base substrate 2 can be reduced, so that it is possible to increase the degree of freedom in the layout, for example, form other patterns on the base substrate 2, and to reduce the material cost required for forming the lands 3. As a result, it is possible to reduce the manufacturing cost of electronic equipment using the mounting substrate 11.

In the sample shown in FIG. 3, the lands 3 arranged only on one side of the groove 5, are connected to each other by means of the wiring pattern 4 formed into the U-shape; however, such a wiring pattern 4 may be formed into any shape insofar as it crosses one groove twice or more. The size and shape of the land 3 are not limited to those shown in FIG. 3.

In the first and second embodiments, of the three sets of the lands formed on the base substrate 2, the lands 3 in one set are connected to each other by means of the two wiring patterns 4; however, according to the present invention, the lands 3 in each set may be formed in such a manner as to be connected to each other by means of at least one wiring pattern.

For example, in the mounting substrate 1 shown in FIG. 2, the paired lands 3 at the right lower corner of the base substrate 2, having a diagonal relationship with the paired lands 3 positioned at the left upper corner of the base substrate 2 and connected to each other by means of the wiring pattern 4 crossing the transverse groove 5a and the wiring pattern 4 crossing the longitudinal groove 5d, may be connected to each other by means of not only the wiring pattern 4 crossing the transverse groove 5b but also the wiring pattern 4 crossing the longitudinal groove 5c. In this case, the paired lands 3 positioned at the right upper corner and connected to each other by means of the wiring pattern 4 crossing the longitudinal groove 5c may be omitted, and accordingly, it is possible to reduce the number of the lands 3 provided on the base substrate 2, and hence to further reduce the material cost required for forming the lands 3.

In the first and second embodiments, description has been made by way of the examples in which the lands 3 are provided only in the first unusable substrate region $B_1$, taken as the non-contact portion with solder, of the unusable substrate region B of the base substrate 2 or in both the first unusable substrate region $B_1$ and the usable substrate region A; however, according to the present invention, the lands 3 may be provided only in the usable substrate region A. Even in this case, since the usable substrate region A is not discarded, it is possible to prevent occurrence of a noxious material containing waste when the unusable substrate region is separated from the usable substrate region and is discarded.

In the case of forming the mounting substrate in which the lands are provided only in the usable substrate region, the layout of the lands and the wiring patterns can be configured such that the wiring patterns of the same number as that of the grooves are each formed in such a manner as to cross the same groove twice or more and not to cross the other grooves and one set of the lands connected to each other by means of all of the above wiring patterns are arranged in the usable substrate region. With this configuration, since the number of the lands arranged on the base substrate can be minimized, it is possible to significantly reduce the material cost for forming the lands, and hence to further reduce the manufacturing cost of electronic equipment using the mounting substrate.

In the first and second embodiments, description has been made by way of the example in which the on-substrate members of the present invention are composed of the conduction state checking lands; however, they may be other members insofar as they have a wettability against solder. For example, the on-substrate members may be members necessary for manufacture, such as marks for alignment of electronic parts, having surfaces from which resist films are removed and which exhibit a wettability against solder upon soldering treatment, or may be lands for actually mounting electronic parts in the usable substrate region (hereinafter, referred to as "mounting lands").

Like the conduction state checking lands, the above-described members necessary for manufacture, such as alignment marks, are provided on the base substrate in such a manner as to be arranged in the non-contact portion with solder of the unusable substrate region, in the usable substrate region, or in the non-contact portion and the usable substrate region. Accordingly, it is possible to prevent occurrence of a noxious material containing waste when the unusable substrate region is separated from the usable substrate region of the base substrate provided with the members necessary for manufacture and the like on which solder are stuck and is discarded. In the case of using the mounting lands as the on-substrate members of the present invention, since the mounting lands are arranged in the usable substrate region, it is possible to prevent occurrence of a noxious material containing waste when the unusable substrate region is discarded, and also to make the mounting lands serve as the conduction state checking lands, and hence to reduce the material cost required for forming the conduction state checking lands.

While the preferred embodiments of the present invention are described using the specific terms, such description is for illustrative purposes only, and it is to be understood that changes and variations may be made without departing from the spirit or scope of the following claims.

What is claimed is:

1. A mounting substrate comprising:

a base substrate having a usable substrate region used as part of a product and an unusable substrate region to be discarded, said base substrate being subjected to soldering treatment in which the surface thereof is brought into contact with solder; and on-substrate members arranged on a soldering surface side, to be subjected to said soldering treatment, of said base substrate, and on-substrate members being in a state in which the surfaces have a wettability against solder upon soldering treatment;

wherein said on-substrate members are arranged in a non-contact portion with solder upon solder treatment in said unusable region, in said substrate region, or in said non-contact portion and said usable substrate region wherein a groove for separating said usable substrate region from said unusable substrate region is formed on the soldering surface side of said base substrate;

said on-substrate members comprising members necessary only for manufacture and in a state in which the surface thereof have a wettability against solder upon soldering treatment; and wherein said members necessary only for manufacture comprise a set of a plurality of lands electrically connected to each other, said set of lands being arranged in said non-contact portion, in said usable substrate region, or in said non-contact portion and said usable substrate region, for checking whether or not said groove is certainly formed on the basis of the conduction state of said lands in said set.

2. A mounting substrate according to claim 1, wherein said on-substrate members comprise marks necessary only for manufacture, said marks being in a state in which the surfaces thereof have a wettability against solder upon soldering treatment.

3. A mounting substrate according to claim 1, wherein said base substrate has, on the soldering surface side, at least one groove for separating said usable substrate region from said unusable substrate region and one wiring pattern for each of said grooves, said wiring pattern being formed in such a manner as to cross said groove; and said lands in said set are electrically connected to each other by means of at least one of said wiring patters.

4. A mounting substrate according to claim 3, wherein at least two of said plurality of lands in said set are arranged only on one side of said groove; and said two lands arranged only on one side of said groove are connected to each other by said wiring pattern which extends from one of said two lands, crossing said groove twice or more but not crossing the other grooves, and is connected to the other of said two lands.

5. A mounting substrate comprising:

a base substrate having a usable substrate region used as part of a product and an unusable substrate region to be discarded, said base substrate being subjected to soldering treatment in which a soldering surface side thereof is brought into contact with solder; and on-substrate members arranged on said soldering surface side, to be subjected to said soldering treatment, of said base substrate, said on-substrate members being in a state in which the surfaces have a wettability against solder upon soldering treatment; and wherein said on-substrate members are arranged in a non-contact portion with solder upon solder treatment in said unusable region, in said substrate region, or in said non-contact portion and said usable substrate region, said on-substrate members comprising a set of a plurality of lands electrically connected to each other, said set of lands being arranged in said non-contact portion, in said usable substrate region, or in said non-contact portion and said usable substrate region.

6. A mounting substrate according to claim 5, wherein a groove for separating said usable substrate region from said unusable substrate region is formed on the soldering surface side of said base substrate.

7. A mounting substrate according to claim 5, wherein said on-substrate members comprise members necessary only for manufacture and in a state in which the surfaces thereof have a wettability against solder upon soldering treatment.

8. A mounting substrate according to claim 5, further including means for checking whether or not said groove is certainly formed on the basis of the conduction state of said lands in said set.

9. A mounting substrate according to claim 5, wherein said on-substrate members comprise marks necessary only for manufacture, said marks being in a state in which the surfaces thereof have a wettability against solder upon soldering treatment.

10. A mounting substrate according to claim 5, wherein said base substrate has, on the soldering surface side, at least one groove for separating said usable substrate region from said unusable substrate region and one wiring pattern for each of said grooves, said wiring pattern being formed in such a manner as to cross said groove; and said lands in said set are electrically connected to each other by means of at least one of said wiring patters.

11. A mounting substrate according to claim 10, wherein at least two of said plurality of lands in said set are arranged only on one side of said groove; and said two lands arranged only on one side of said groove are connected to each other by said wiring pattern which extends from one of said two lands, crossing said groove twice or more but not crossing the other grooves, and is connected to the other of said two lands.

* * * * *

UNITED STATES PATENT AND TRADEMARK OFFICE
CERTIFICATE OF CORRECTION

PATENT NO. : 6,392,161 B1
DATED : May 21, 2002
INVENTOR(S) : Michitoshi Tsuchiya It is certified that error appears in the above-identified patent and that said Letters Patent is hereby corrected as shown below:

Title Page,
Item [57], ABSTRACT,
Line 1, "having a" should read -- having an --.

Column 9,
Line 37, "patters" should read -- patterns --.

Signed and Sealed this

Sixteenth Day of September, 2003

JAMES E. ROGAN
*Director of the United States Patent and Trademark Office*